(12) United States Patent
Lee

(10) Patent No.: US 8,456,888 B2
(45) Date of Patent: Jun. 4, 2013

(54) SEMICONDUCTOR MEMORY DEVICE INCLUDING VARIABLE RESISTANCE ELEMENTS AND MANUFACTURING METHOD THEREOF

(75) Inventor: Seung Hyun Lee, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 231 days.

(21) Appl. No.: 12/899,912

(22) Filed: Oct. 7, 2010

(65) Prior Publication Data

US 2012/0087171 A1    Apr. 12, 2012

(51) Int. Cl.
*G11C 11/00*        (2006.01)

(52) U.S. Cl.
USPC ............. 365/148; 365/46; 365/55; 365/74; 365/97; 365/100; 365/131; 365/158; 365/171; 365/173; 365/163; 438/382; 257/E21.004

(58) Field of Classification Search
USPC ............. 365/148, 46, 55, 74, 97, 100, 131, 365/158, 171, 173, 163; 438/382; 257/E21.004
See application file for complete search history.

(56) References Cited

U.S. PATENT DOCUMENTS

2007/0267721 A1* 11/2007 Kuh et al. .............. 257/616
2009/0273961 A1* 11/2009 Ono et al. .............. 365/51

FOREIGN PATENT DOCUMENTS

| JP | 2003-332535 | 11/2003 |
| JP | 2008-034057 | 2/2008 |
| JP | 2008-258362 | 10/2008 |
| KR | 1020080065138 | 7/2008 |
| KR | 1020100015040 | 2/2010 |

* cited by examiner

*Primary Examiner* — Fernando Hidalgo
(74) *Attorney, Agent, or Firm* — IP & T Group LLP

(57) ABSTRACT

A semiconductor memory device with a variable resistance element includes a plurality of active areas isolated from one another by an isolation layer formed in a substrate, a plurality of word lines crossing over the plurality of active areas, an auxiliary source line disposed between two selected word lines and commonly connected to at least two active areas among the plurality of active areas between the two selected word lines, and a plurality of contact plugs each connected to a corresponding active area.

16 Claims, 13 Drawing Sheets

SEMICONDUCTOR MEMORY DEVICE INCLUDING VARIABLE RESISTANCE ELEMENTS AND MANUFACTURING METHOD THEREOF

BACKGROUND OF THE INVENTION

Exemplary embodiments of the present invention relate to a semiconductor memory device and a manufacturing method thereof, and more particularly, to a semiconductor memory device using a variable resistance element, and a manufacturing method thereof.

In general, a semiconductor memory device includes a large number of memory cells. A representative semiconductor memory device is a dynamic random access memory (DRAM). A typical unit memory cell of a DRAM includes one switch and one capacitor. A DRAM has a high integration density and a fast operating speed. However, because a DRAM implements "0" and "1" according to a change in the quantity of electric charge, a DRAM is a volatile memory device, which loses stored data after power is interrupted. That is, a DRAM has difficulty retaining data. To address this concern, research into new memory technology has been conducted to implement a binary state corresponding to "0" and "1" of a DRAM by using other characteristics, instead of the quantity of electric charge.

Examples of nonvolatile memory devices which have been recently researched include a magnetic random access memory (MRAM) configured with a magneto-resistance element using a magneto-resistance effect, a ferroelectric random access memory (FRAM) configured with a ferroelectric element using a polarization characteristic of a ferroelectric material, and a phase-change random access memory (PRAM) configured with a phase-change element using a phase-change material. In addition, research and development has been rapidly conducted on a resistance switching random access memory (ReRAM), which uses an element that exists as an insulator in an inherent state and changes to a metal or semiconductor state when an external voltage is applied. In the case of memory devices based on such a variable resistance element, it is necessary to supply a relatively large amount of electric current in order to write and read data. Further, in order to configure a highly integrated memory, it is necessary to minimize the influence of external resistance, such as resistance of signal lines through which signals are inputted and outputted.

Meanwhile, signal lines in a cell array of a semiconductor memory device are configured to connect elements, such as source lines, transistors, variable resistance elements (storage nodes), and bit lines, through several contact plugs. However, in the case in which electrical paths are configured through several contact plugs, there is a limitation on reducing a total resistance of signal lines due to reduction in a contact area caused by a down-scaling of the memory device. Down-scaling a memory device may increase a resistance of its contact plugs and an interfacial resistance, which is generated in a contact region between the contact plugs and the elements. In the case of a memory device using a variable resistance element, it is particularly desirable to reduce an electrical resistance of signal lines, such as source lines and bit lines. In general, an electrical resistance of signal lines may be reduced by using a material having a high electrical conductivity or increasing the height and width of metal interconnections. However, such methods may limit the degree of integration of the memory device. Therefore, there is a demand for a new manufacturing process that produces a memory device, having a variable resistance element, which may have a reduced external resistance while an external signal is inputted and outputted, so that a high integration of the memory device may be achieved.

SUMMARY OF THE INVENTION

Exemplary embodiments of the present invention are directed to a semiconductor memory device, including a variable resistance element, which may have a reduced electrical resistance in a signal line through which a signal is inputted and outputted, and a manufacturing method thereof.

Exemplary embodiments of the present invention are also directed to a semiconductor memory device, including a variable resistance element, in which a source line and a bit line connected to a memory cell are formed on the same layer level to thereby simplify a process of forming a signal line, and a manufacturing method thereof.

In accordance with an exemplary embodiment of the present invention, a semiconductor memory device with a variable resistance element, includes a plurality of active areas isolated from one another by an isolation layer formed in a substrate, a plurality of word lines crossing over the plurality of active areas, an auxiliary source line disposed between two selected word lines among the plurality of word lines and commonly connected to at least two active areas among the plurality of active areas, and a plurality of contact plugs each connected to a corresponding active area.

The semiconductor memory device may further include a plurality of variable resistance elements each of which is electrically connected to a corresponding one of the plurality of contact plugs, a main source line electrically connected to the auxiliary source line, and a bit line electrically connected to the plurality of variable resistance elements.

The plurality of word lines, the plurality of auxiliary source lines, and the plurality of contact plugs may be arranged at the same layer level.

The variable resistance element may be at least one selected from the group consisting of a magneto-resistance element, a phase-change element, and a ferroelectric element.

The main source line and the bit line may be arranged at the same layer level.

The main source line and the bit line may be arranged in parallel to each other.

In accordance with another exemplary embodiment of the present invention, a method for manufacturing a semiconductor memory device with a variable resistance element includes forming an isolation layer in a semiconductor substrate to define a plurality of active areas, forming a plurality of word lines crossing over the plurality of active areas, forming an auxiliary source line disposed between two selected word lines among the plurality of word lines and commonly connected to at least two active areas among the plurality of active areas between the two selected word lines, and forming a plurality of contact plugs each connected to a corresponding active area.

The method may further include forming a plurality of variable resistance elements each of which is electrically connected to a corresponding one of the plurality of contact plugs, and forming a main source line electrically connected to the auxiliary source line, and a bit line electrically connected to the plurality of variable resistance elements.

The auxiliary source line and the plurality of contact plugs may be substantially formed at the same time.

The main source line and the bit line may be insulated from each other by an insulation layer formed on the semiconductor substrate in which the variable resistance element is formed.

The main source line and the bit line may be parallel to each other.

In accordance with yet another exemplary embodiment of the present invention, a semiconductor memory device with a variable resistance element includes a plurality of active areas, at least two word lines crossing over the plurality of active areas, an auxiliary source line commonly connected to at least two active areas and arranged between the two word lines, at least a first contact plug connected to one of the active areas on the other side of one of the two word lines between which the auxiliary source line is arranged, a variable resistance element having one terminal connected to the first contact plug, a second contact plug connected to the auxiliary source line, a bit line connected to the other terminal of the variable resistance element, and a source line connected to the second contact plug, wherein the bit line and the source line are disposed at the substantially same height.

The height of the second contact plug may be up to that of a top surface of the variable resistance element.

The variable resistance element may be one selected from the group consisting of a magneto-resistance element, a phase-change element, and a ferroelectric element.

The source line and the bit line may be disposed in parallel.

The source line or the bit line may include copper (Cu) or aluminum (Al).

In accordance with still another exemplary embodiment of the present invention, a method for manufacturing a semiconductor memory device with a variable resistance element includes forming a plurality of active areas, forming at least two word lines crossing over the plurality of active areas, forming an auxiliary source line commonly connected to at least two active areas and arranged between the two word lines by performing a self-align process using the two word lines, forming at least a first contact plug connected to one of the active areas on the other side of one of the two word lines between which the auxiliary source line is arranged, forming a variable resistance element having one terminal connected to the first contact plug, forming a second contact plug connected to the auxiliary source line, forming a bit line connected to the other terminal of the variable resistance element, and forming a source line connected to the second contact plug, wherein the bit line and the source line are disposed at the substantially same height.

The height of the second contact plug may be up to that of a top surface of the variable resistance element.

The variable resistance element may be one selected from the group consisting of a magneto-resistance element, a phase-change element, and a ferroelectric element.

The source line and the bit line may be disposed in parallel.

In accordance with still another exemplary embodiment of the present invention, a semiconductor memory device includes an active region, a word line over the active region, an auxiliary source line connected to the active region on one side of the word line, a first contact plug connected to the active region on the other side of the word line, a variable resistance element connected to the contact plug, a bit line connected to the variable resistance element, and a source line connected to the auxiliary source line.

DESCRIPTION OF SPECIFIC EMBODIMENTS

Figure 1A:
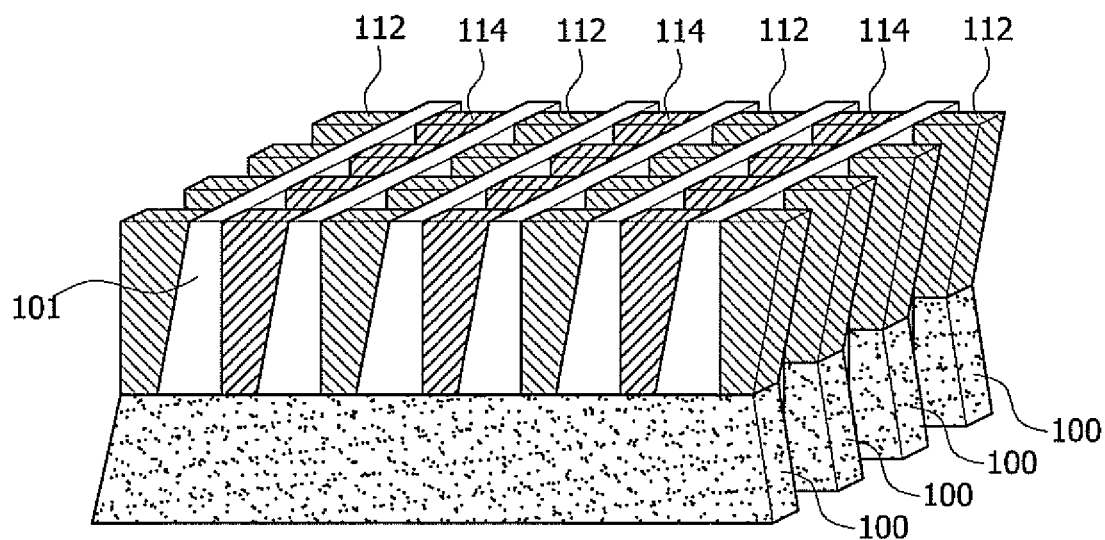
FIGS. 1A to 1F are perspective views illustrating a method for manufacturing a cell array of a semiconductor memory device in accordance with a first exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. Elements constituting a cell array of a semiconductor memory device, for example, an active area, a word line, a source line, a bit line, a variable resistance element, and a contact plug, which are formed in a semiconductor substrate, may be electrically insulated by an insulation layer, such as an oxide layer or a nitride layer. However, in order to provide a clearer explanation of the connection states of the elements constituting the cell array, the illustration of such an insulation layer is omitted in the accompanying drawings.

First Exemplary Embodiment

FIGS. 1A to 1F are views illustrating sequential processes of manufacturing a cell array of a semiconductor memory device in accordance with a first exemplary embodiment of the present invention.

Referring to FIG. 1A, a plurality of active areas 100 are defined by forming isolation layers (not shown) in a semiconductor substrate (for example, a silicon substrate) in which a memory cell array is to be formed. That is, the active areas 100 are isolated from one another by the isolation layers formed of, for example, silicon oxide. Then, a plurality of word lines 101 are formed on the semiconductor substrate in which the active areas 100 are formed. The respective word lines 101 cross over the plurality of active areas 100 and are parallel to one another. Also, the word lines 101 may be spaced apart from one another by a certain distance. Herein, each of the word lines 101 may include a gate oxide layer, a gate conductive layer formed of polysilicon, and a hard mask layer for protecting the gate conductive layer in a subsequent etching process, which are sequentially stacked on the semiconductor substrate. Further, the word lines 101 may include an insulation spacer formed on a sidewall of the stacked structure. The hard mask layer and the insulation spacer of the word lines 101 may include a silicon oxide layer or a silicon nitride layer. After forming the word lines, source/drain diffusion areas (not shown) are formed by injecting an appropriate concentration of impurities into the active areas 101 exposed at both sides of the word lines 101.

Then, an insulation layer is formed over the semiconductor substrate in which the plurality of word lines 101 are formed. Following the formation of the insulation layer, a planarization process may be performed to expose the word lines 101. The planarization process may be a chemical mechanical polishing (CMP) process. Consequently, gaps between the word lines 101 are filled with the insulation layer.

Photoresist patterns (not shown) are formed on the semiconductor substrate in which the above-described structure is formed. The photoresist patterns are formed on the word lines 101 and the insulation layer filled between the word lines 101. Also, the photoresist patterns have openings exposing portions of the insulation layer, which are directly above the active areas 100 between the adjacent word lines 101. These exposed portions of the insulation layer are removed by performing an etching process using the photoresist patterns as an etch barrier. As a result of the etching process, a plurality of contact holes are formed to expose portions of the active areas 100 (i.e., the surface of the semiconductor substrate) on both sides of the word lines 101. As illustrated in FIG. 1A, the contact holes are filled with a conductive material (e.g., a conductive metal material, polysilicon, etc.) to form a plurality of contact plugs 112 and 114 between the word lines 101. For reference, the insulation layer filled between the word lines 101 is not illustrated in FIG. 1A, and those of ordinary skill in the art should understand that the regions indicated by empty spaces between the plurality of contact plugs 112 and 114 in FIG. 1A are actually filled by the insulation layer.

Figure 1B:
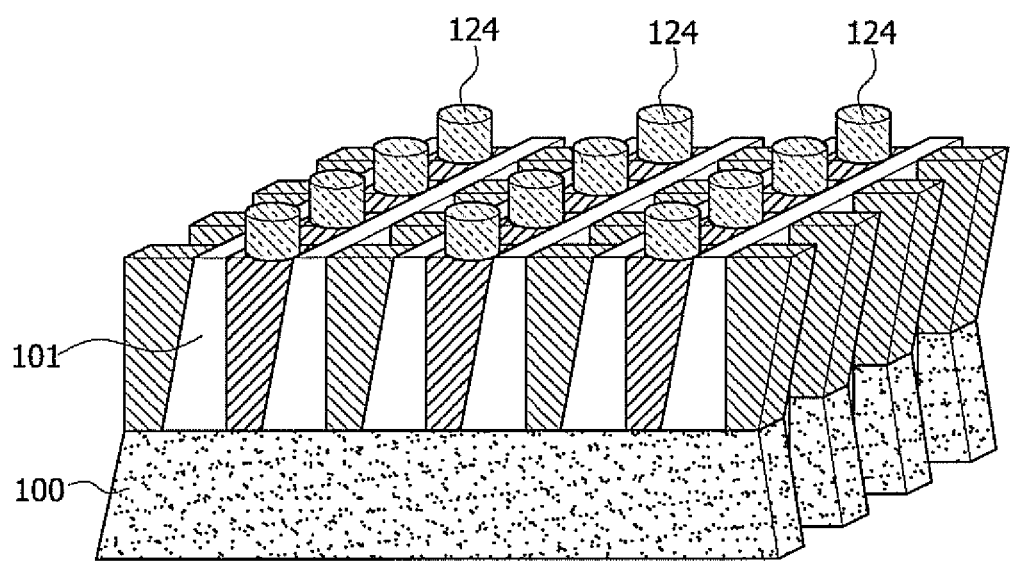
Figure 1C:
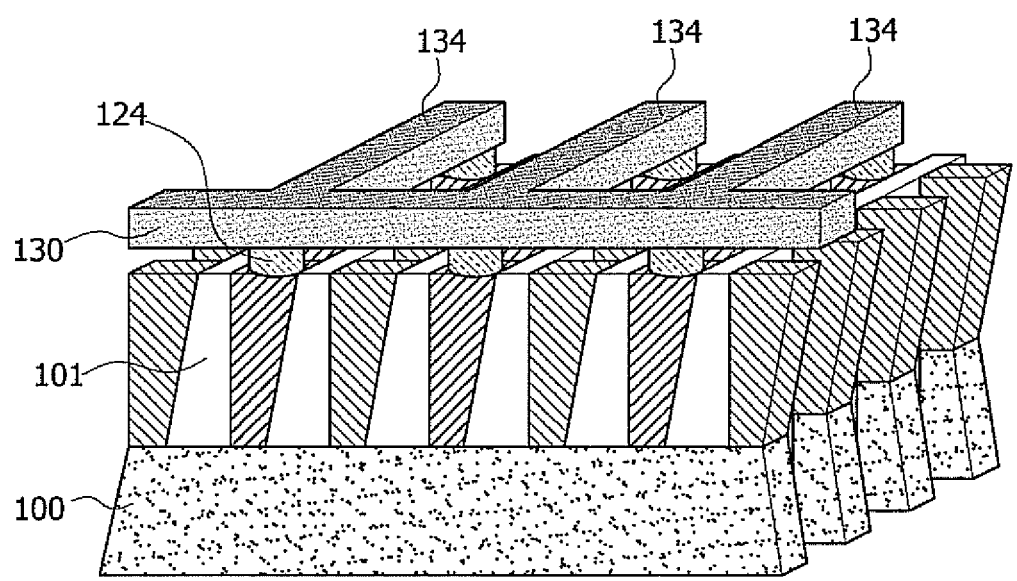

Referring to FIG. 1B, source line contacts 124 connected to the first contact plugs 114 are formed. Referring to FIG. 1C, a main source line 130 and auxiliary source lines 134 are formed. Further, the main source line 130 is electrically connected to the auxiliary source lines 134. The main source line 130 is formed to be electrically connected to at least two of the source line contacts 124 that are aligned in a line that crosses over the word lines 101. Meanwhile, the auxiliary source lines 134 are formed to be electrically connected to at least two of the source line contacts 124 that are aligned in a line that is parallel with the word lines 101. For reference, although not illustrated in FIGS. 1B and 1C, the source line contacts 124, the auxiliary source lines 134, and the main source line 130 may be surrounded by one or more insulation layers. For example, the source line contacts 124, the auxiliary source lines 134, and the main source line 130 may be formed by forming an insulation layer (e.g., an interlayer dielectric layer) on the structure of FIG. 1A and performing a photolithography process and a metal formation process.

Figure 1D:
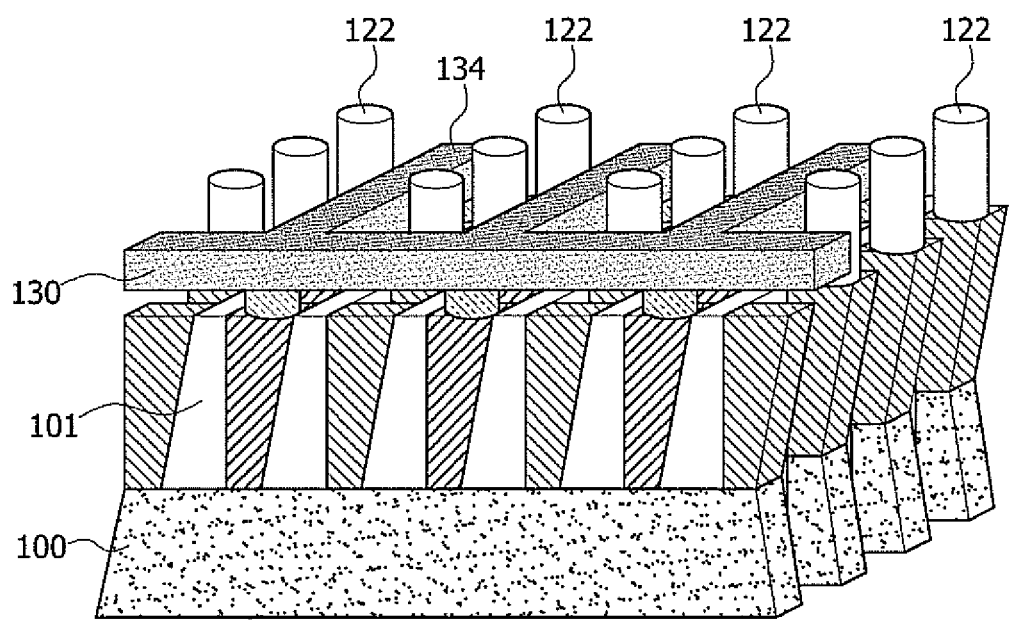
Figure 1E:
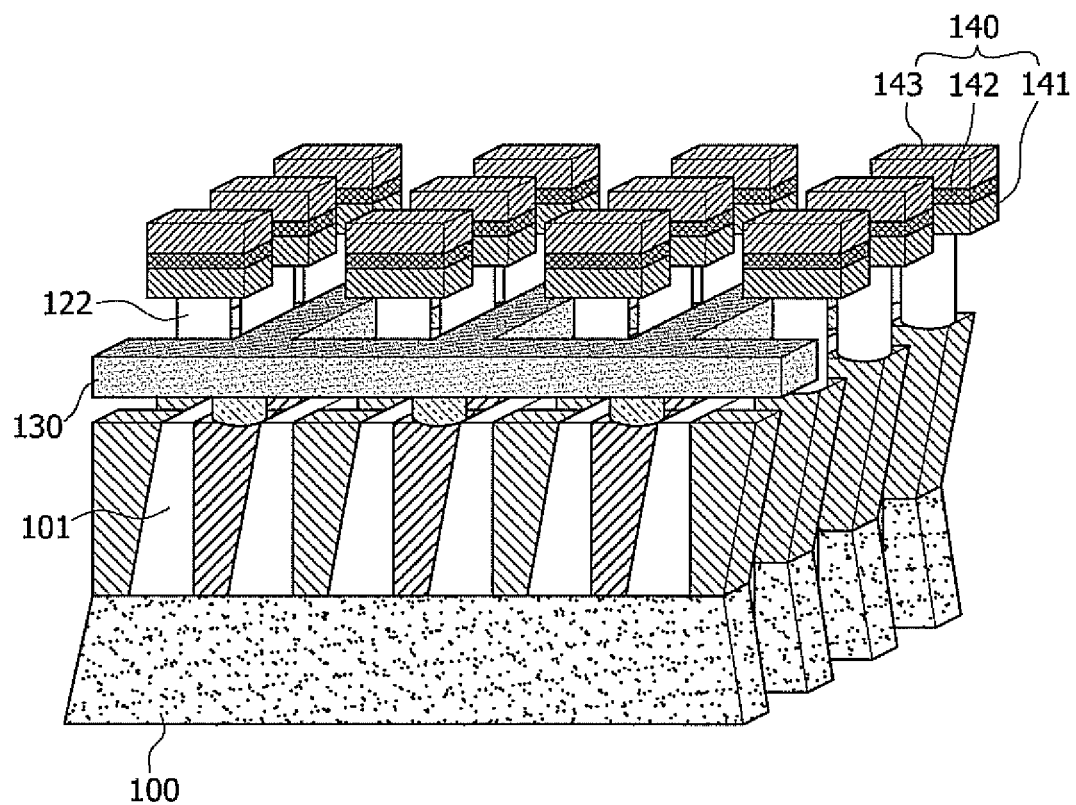
Figure 1F:
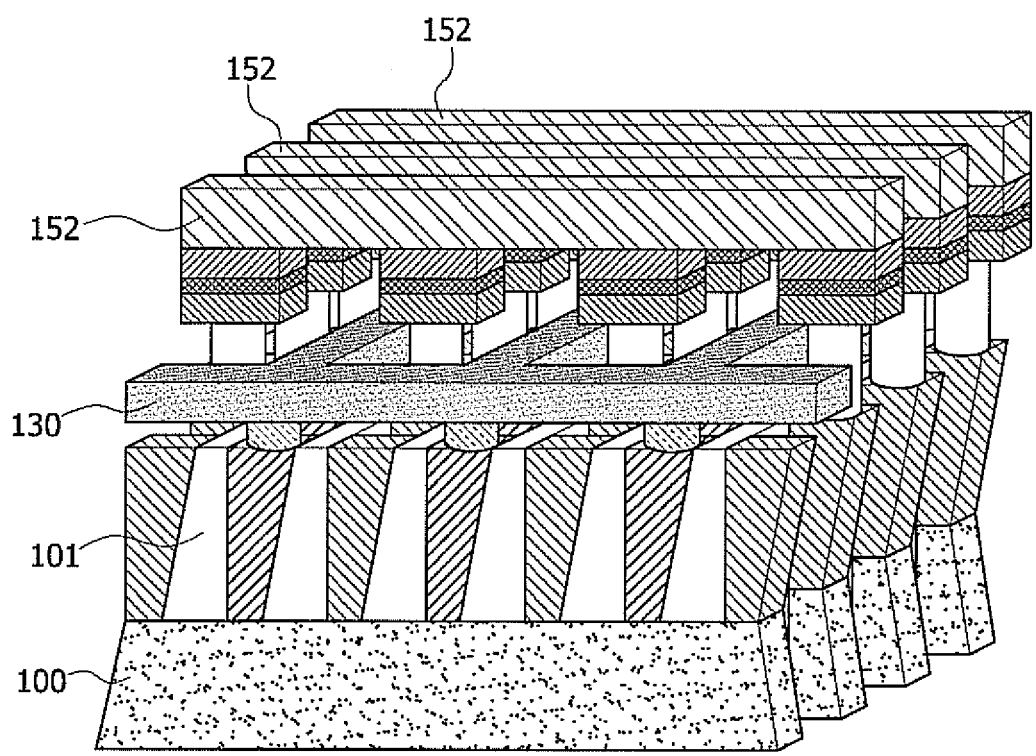

Referring to FIG. 1D, bit line contacts 122 connected to the second contact plugs 112 are formed. Referring to FIG. 1E, variable resistance elements, having one terminal connected to the bit line contacts 122, are formed (in this embodiment, magneto-resistance elements such as magnetic tunnel junction (MTJ) elements are illustrated). The magneto-resistance element 140 may include a pinned magnetic layer 141, a tunnel barrier layer 142, and a free magnetic layer 143. Referring to FIG. 1F, a plurality of bit lines 152 are formed. More specifically, each of the plurality of bit lines 152 are formed to connect to the magneto-resistance elements 140 aligned in a line crossing the word lines 101. Thus, the bit lines 152 are parallel to one another and separated by a certain distance. For reference, the bit line contacts 122, the magneto-resistance elements 140, and the bit lines 152 are surrounded by one or more insulation layers, and may be formed through a process of forming an insulation layer (e.g., an interlayer dielectric layer), performing a photolithography process, and forming a metal.

In general, the semiconductor memory device including the variable resistance element uses the source line and the bit line to input and output the signals. In order to improve the operation performance of the semiconductor memory device including the variable resistance element, it is important to reduce the resistances of the source line and the bit line. The resistances of the source line and the bit line can be reduced by using a material having high electrical conductivity or increasing the width and height of the lines. However, when implementing a highly integrated memory device, there is a limit in reducing the resistances of the source line and the bit line by increasing the width and height of the lines.

The present invention proposes a semiconductor memory device including a variable resistance element, in which local source lines are formed through a self-align process and a main source line is disposed at the same height as a bit line. In this manner, the source lines can be efficiently disposed, thereby simplifying a manufacturing process. Also, the resistance of the source line can be reduced by forming the source line in the same layer as the bit line having high electrical conductivity. Furthermore, a process of forming a source line contact can be omitted. Consequently, a highly integrated memory device having high cell efficiency can be easily implemented.

Second Embodiment

FIGS. 2A to 2E are views illustrating sequential processes of manufacturing a cell array of a semiconductor memory device in accordance with a second exemplary embodiment of the present invention. The first exemplary embodiment requires a multilayer structure of insulation layers, such as interlayer dielectric layers. The second exemplary embodiment can further reduce the number of the insulation layers. For example, the first exemplary embodiment forms at least six insulation layers, that is, the insulation layer between the word lines, the insulation layer for forming the source line contacts, the insulation layer for forming the auxiliary source lines and the main source line, the insulation layer for forming the bit line contacts, the insulation layer for forming the variable resistance elements, and the insulation layer for forming the bit lines. However, in the case of the second exemplary embodiment, the number of insulation layers formed can be reduced to three. Furthermore, the electric resistances of signal lines can be reduced by minimizing the lengths of transistors, variable resistance elements, and signal lines (source lines and bit lines). The second exemplary embodiment is described below in more detail with reference to the accompanying drawings.

Figure 2A:
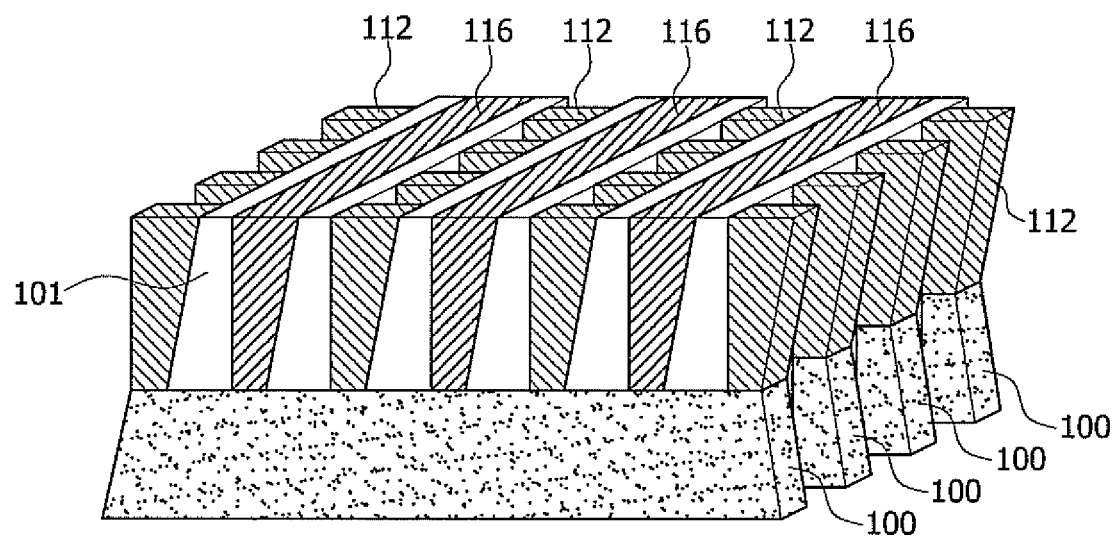
FIGS. 2A to 2E are perspective views illustrating a method for manufacturing a cell array of a semiconductor memory device in accordance with a second exemplary embodiment of the present invention.

Referring to FIG. 2A, a plurality of active areas 100 are defined by forming isolation layers (not shown) in a semiconductor substrate (for example, a silicon substrate) in which a memory cell array is to be formed. That is, the active areas 100 are isolated from one another by the isolation layers formed of, for example, silicon oxide. Then, a plurality of word lines 101 are formed on the semiconductor substrate in which the active areas 100 are formed. The respective word lines 101 cross over the plurality of active areas 100 and are parallel to one another. Also, the word lines 101 may be spaced apart from one another by a certain distance. Herein, each of the word lines 101 may include a gate oxide layer, a gate conductive layer formed of polysilicon, and a hard mask layer for protecting the gate conductive layer in a subsequent etching process, which are sequentially stacked on the semiconductor substrate. Further, the word lines 101 may include an insulation spacer formed on a sidewall of the stacked structure. The hard mask layer and the insulation spacer of the word lines 101 may include a silicon oxide layer or a silicon nitride layer. After forming the word lines, source/drain diffusion areas (not shown) are formed by injecting an appropriate concentration of impurities into the active areas 101 exposed at both sides of the word lines 101.

Then, an insulation layer is formed over the semiconductor substrate in which the plurality of word lines 101 are formed. Following the formation of the insulation layer, a planarization process may be performed to expose the word lines 101. The planarization process may be a chemical mechanical polishing (CMP) process. Consequently, gaps between the word lines 101 are filled with the insulation layer.

Photoresist patterns (not shown) are formed on the semiconductor substrate in which the above-described structure is formed. The photoresist patterns are formed on the word lines 101 and the insulation layer filled between the word lines 101. Also, the photoresist patterns have openings exposing portions of the insulation layer, which are directly above the active areas 100 between the adjacent word lines 101. These exposed portions of the insulation layer are removed by performing an etching process using the photoresist patterns as an etch barrier.

Meanwhile, unlike the first exemplary embodiment, an auxiliary source line formation area (not shown) and a contact plug formation area (not shown) are formed by etching the insulation layer. The auxiliary source line formation area simultaneously exposes at least two active areas of the plurality of active areas 100 between the adjacent word lines 101. The contact plug formation area exposes only one active area of the plurality of active areas 100 between the adjacent word lines 101.

The auxiliary source line formation area and the contact plug formation area are formed by removing a portion of the insulation layer buried between the word lines 101 in the previous process. As illustrated in FIG. 2A, the area in which the insulation layer is removed may be filled with a conductive material (e.g., a metal material, polysilicon, etc.) in a subsequent process to thereby form auxiliary source lines 116 and contact plugs 112. The auxiliary source lines 116 and the contact plugs 112 may be formed using a metal material having a small electrical resistance, for example, tungsten (W), aluminum (Al), or copper (Cu). Furthermore, before filling the auxiliary source line formation area and the contact plug formation area with the conductive metal material, silicide layers may be formed in order to minimize an interfacial resistance when joining the exposed active areas 100 (that is, the source or drain diffusion areas) and the silicon substrate. For example, the silicide may be formed by forming a material, such as titanium (Ti) or cobalt (Co), and reacting it with silicon through a thermal treatment. The auxiliary source lines 116 are formed by a self-align process using word line patterns.

In particular, as illustrated in FIG. 2A, each of the auxiliary source lines 116 are simultaneously connected to two or more active areas disposed under the auxiliary source lines 116 (at least two active areas isolated from each other), while each of the contact plugs 112 are connected to only one of the active areas. Furthermore, the auxiliary source lines 116 and the contact plugs 112 are formed between the adjacent word lines 101. Therefore, the auxiliary source lines 116 and the contact plugs 112 may be formed at the same layer level as the word lines 101. Moreover, the auxiliary source lines 116 and the contact plugs 112 may be alternately and repetitively formed. For example, as shown in FIG. 2A, for each word line, contact plugs 112 are formed on one side of the word line 101, while a source line 116 is formed on the other side of the same word line 101.

Figure 2B:
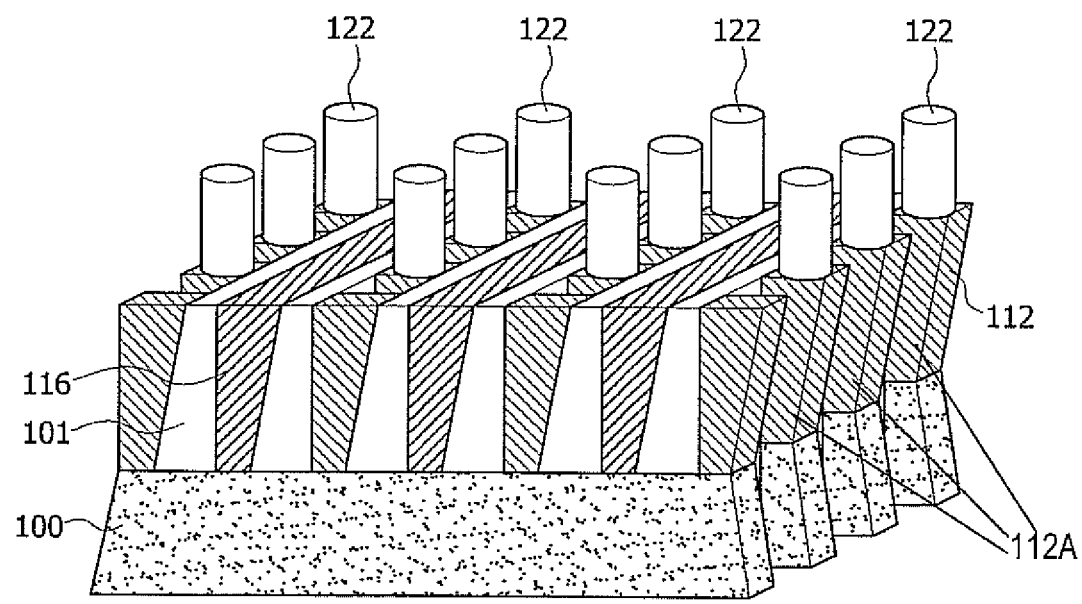
Figure 2C:
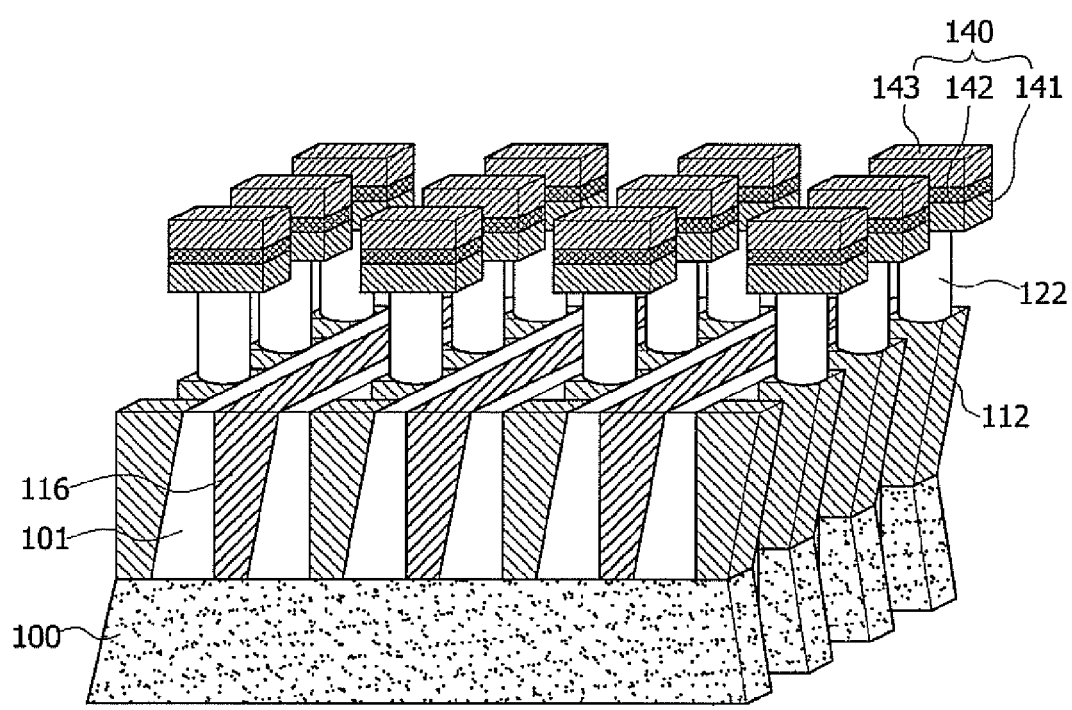
Figure 2D:
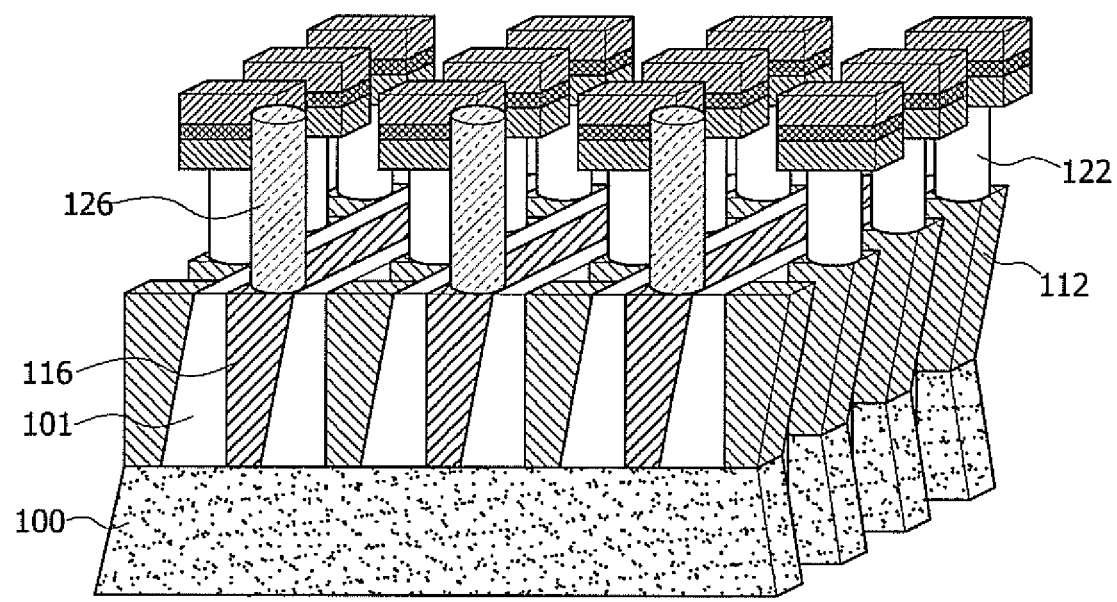

Referring to FIG. 2B, bit line contacts 122 connected to selected contact plugs 112A among the contact plugs 112 are formed. Referring to FIG. 2C, variable resistance elements, having one terminal connected to the bit line contacts 122, are formed (in this embodiment, magneto-resistance elements such as magnetic tunnel junction (MTJ) elements are illustrated). The magneto-resistance element 140 may include a pinned magnetic layer 141, a tunnel barrier layer 142, and a free magnetic layer 143. Referring to FIG. 2D, source line contacts 126 connected to the auxiliary source lines 116 are formed. The bit line contacts 122, the magneto-resistance elements 140, and the source line contacts 126 are surrounded by one or more insulation layers, and may be formed through a process of forming an insulation layer (e.g., an interlayer dielectric layer), performing a photolithography process, and forming a metal.

Figure 2E:
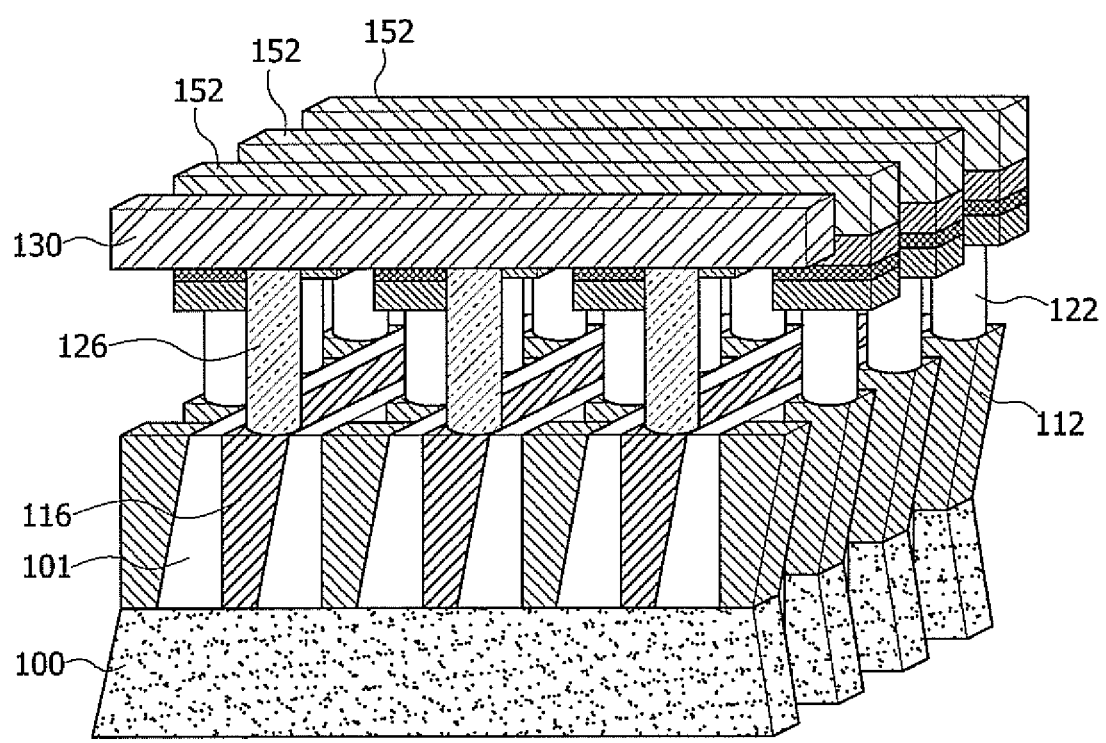

Referring to FIG. 2E, a plurality of bit lines 152 connected to the magneto-resistance elements 140 and a main source line 130 connected to the source line contacts 126 are formed. The main source line 130 and the bit lines 152 may be isolated from one another within the same insulation layer. For example, a sequential process, including forming an interlayer dielectric layer on the structure of FIG. 2D, performing a photolithography process over the interlayer dielectric layer, and finally forming a metal, may be performed to form the main source line 130 and the bit lines 152, so that they are isolated from one another within the same interlayer dielectric layer. In particular, the main source line 130 and the bit lines 152 may be parallel to each other.

In accordance with the second exemplary embodiment, the auxiliary source lines 116 can be formed between the word lines 101 through a self align contact (SAC) process, and the main source line 130 and the bit lines 152 can be formed at the same layer level. Thus, compared with the first exemplary embodiment, the process of forming additional insulation layers can be omitted. Consequently, the electrical resistance of the signal lines connected to the main source line 130 and the auxiliary source lines 116 can be reduced. Further, by reducing the number of insulation layers and simultaneously forming the main source line and the bit lines, the manufacturing process may be simplified.

Meanwhile, in accordance with the second exemplary embodiment, the word lines 101, the contact plugs 112, and the auxiliary source lines 116 can be formed at the same layer level. Also, in the cell array of the semiconductor device in accordance with the second exemplary embodiment of the present invention, the main source line 130 and the bit lines 152 can be formed at the same layer level. Therefore, the manufacturing method in accordance with the exemplary embodiments of the present invention is much simpler and the electrical resistance of the signal line can be reduced. Furthermore, the height of the entire structure formed on the semiconductor substrate can be reduced. Thus, the height of the word line 101 can be relatively increased. Consequently, the cross-sectional area of the signal lines (the auxiliary source line, the main source line, bit line, and so on) can be increased. Hence, when an external signal is inputted, the electrical resistance of the signal lines can be further reduced.

Figure 3:
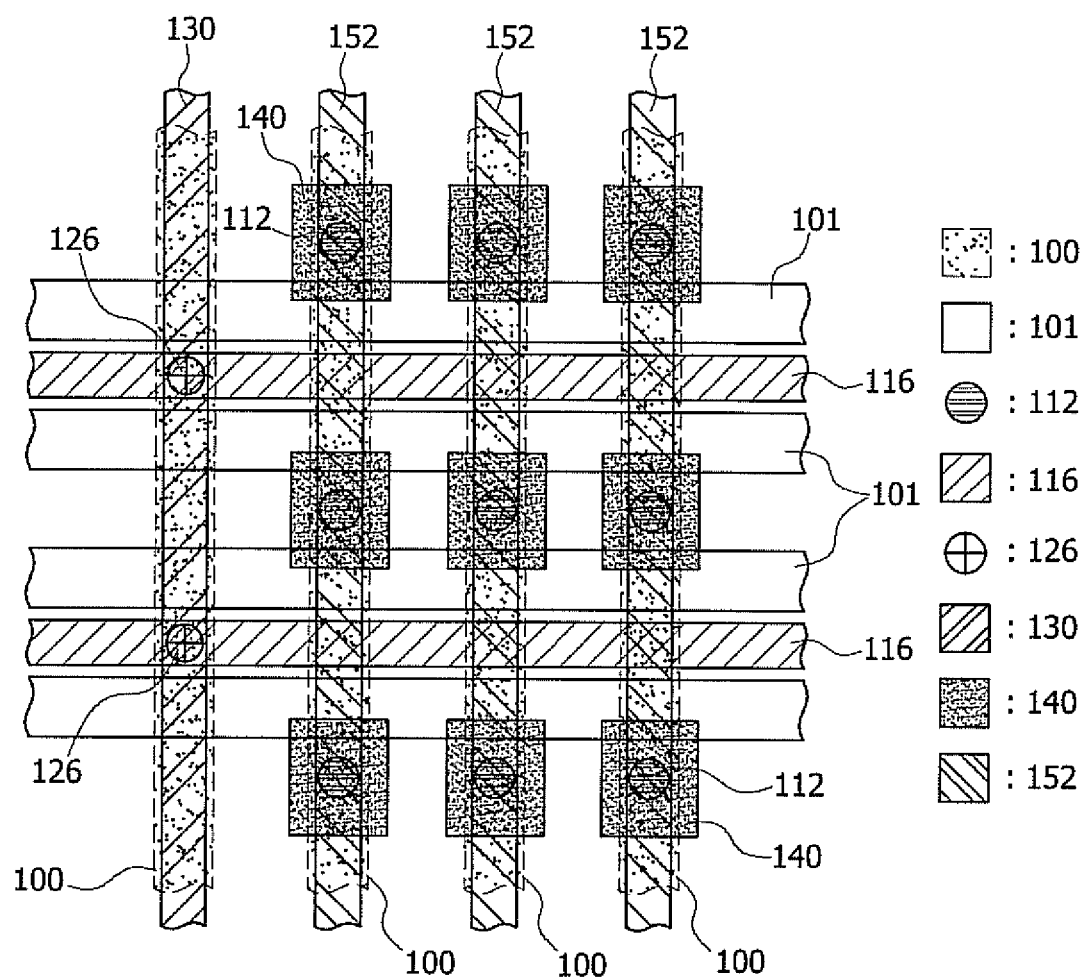
FIGS. 3 and 4 are plan view diagrams illustrating layouts of the cell arrays of the semiconductor memory device in accordance with exemplary embodiments of the present invention.

FIG. 3 is a plan view diagram illustrating an exemplary layout of the cell arrays of a semiconductor memory device in accordance with exemplary embodiments of the present invention. As shown in FIG. 3, the main source line 130 may be in parallel with a number (e.g., 3) of bit lines 152.

Figure 4:
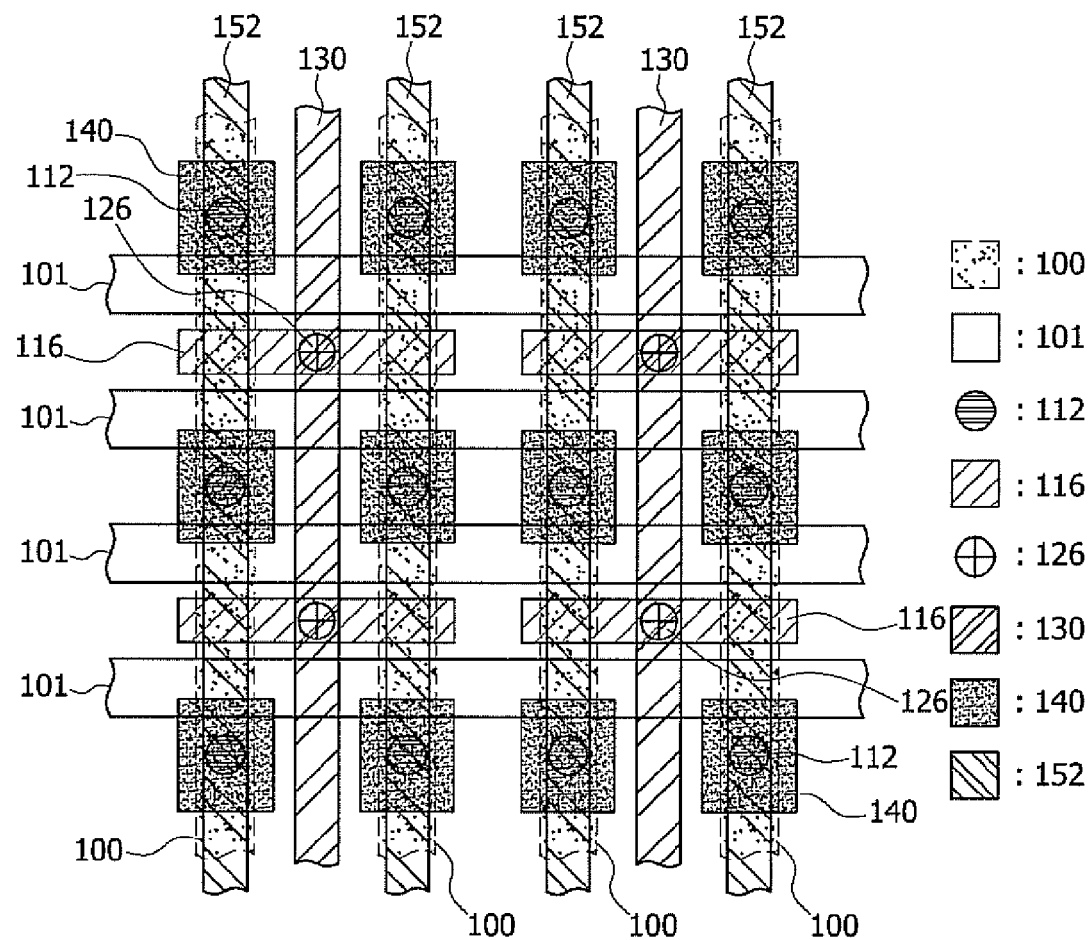

FIG. 4 is a plan view diagram illustrating another exemplary layout of the cell arrays of a semiconductor memory device in accordance with exemplary embodiments of the present invention. As shown in FIG. 4, a main source line 130 may be arranged between each pair of bit lines 152.

In accordance with the exemplary embodiments of the present invention, the contact hole and the signal line through which an external signal is inputted and outputted are simultaneously formed using a SAC process, thereby simplifying the semiconductor manufacturing process.

Furthermore, in the semiconductor device in accordance with the exemplary embodiments of the present invention, each of the signal lines are provided with a smaller number of contact plugs as compared to the conventional art. Moreover, the cross-sectional area of the signal line can be relatively increased, thereby remarkably reducing the electric resistance of each of the signal lines.

In particular, the present invention can significantly contribute to implementation of high integration and high speed operation when the present invention is applied to memory devices having variable resistance elements.

While the present invention has been described with respect to the specific embodiments, it will be apparent to those skilled in the art that various changes and modifications may be made without departing from the spirit and scope of the invention as defined in the following claims. Although the MRAM has been exemplarily described in the foregoing embodiments, the invention may be advantageously applied to high integration and high speed operation of semiconductor memory devices using variable resistance elements, such as PRAM, FRAM, and ReRAM.

What is claimed is:

1. A semiconductor memory device with a variable resistance element, comprising:
    a plurality of active areas isolated from one another by an isolation layer formed in a substrate;
    a plurality of word lines crossing over the plurality of active areas;
    an auxiliary source line disposed between two selected word lines among the plurality of word lines and commonly connected to at least two active areas among the plurality of active areas between the two selected word lines; and
    a plurality of contact plugs each connected to a corresponding active area,
    wherein the main source line and the bit line are arranged at the same layer level.

2. The semiconductor memory device of claim 1, further comprising:
    a plurality of variable resistance elements each of which is electrically connected to a corresponding one of the plurality of contact plugs;
    a main source line electrically connected to the auxiliary source line; and
    a bit line electrically connected to the plurality of variable resistance elements.

3. The semiconductor memory device of claim 1, wherein the plurality of word lines, the plurality of auxiliary source lines, and the plurality of contact plugs are arranged at the same layer level.

4. The semiconductor memory device of claim 1, wherein the variable resistance element is at least one selected from the group consisting of a magneto-resistance element, a phase-change element, and a ferroelectric element.

5. The semiconductor memory device of claim 1, wherein the main source line and the bit line are arranged in parallel to each other.

6. A semiconductor memory device with a variable resistance element, comprising:
    a plurality of active areas;
    at least two word lines crossing over the plurality of active areas;
    an auxiliary source line commonly connected to at least two active areas and arranged between the two word lines;
    at least a first contact plug connected to one of the active areas on the other side of one of the two word lines between which the auxiliary source line is arranged;
    a variable resistance element having one terminal connected to the first contact plug;
    a second contact plug connected to the auxiliary source line;
    a bit line connected to the other terminal of the variable resistance element; and
    a source line connected to the second contact plug, wherein the bit line and the source line are disposed at the substantially same height.

7. The semiconductor memory device of claim 6, wherein the height of the second contact plug is up to that of a top surface of the variable resistance element.

8. The semiconductor memory device of claim 6, wherein the variable resistance element is one selected from the group consisting of a magneto-resistance element, a phase-change element, and a ferroelectric element.

9. The semiconductor memory device of claim 7, wherein the source line and the bit line are disposed in parallel.

10. The semiconductor memory device of claim 8, wherein the source line or the bit line includes copper (Cu) or aluminum (Al).

11. A method for manufacturing a semiconductor memory device with a variable resistance element, comprising:
    forming a plurality of active areas;
    forming at least two word lines crossing over the plurality of active areas;
    forming an auxiliary source line commonly connected to at least two active areas and arranged between the two word lines by performing a self-align process using the two word lines;
    forming at least a first contact plug connected to one of the active areas on the other side of one of the two word lines between which the auxiliary source line is arranged;
    forming a variable resistance element having one terminal connected to the first contact plug;
    forming a second contact plug connected to the auxiliary source line;
    forming a bit line connected to the other terminal of the variable resistance element; and
    forming a source line connected to the second contact plug, wherein the bit line and the source line are disposed at the substantially same height.

12. The semiconductor memory device of claim 11, wherein the height of the second contact plug is up to that of a top surface of the variable resistance element.

13. The method of claim 11, wherein the variable resistance element is one selected from the group consisting of a magneto-resistance element, a phase-change element, and a ferroelectric element.

14. The method of claim 11, wherein the source line and the bit line are disposed in parallel.

15. A semiconductor memory device, comprising:
    an active region;
    a word line over the active region;
    an auxiliary source line connected to the active region on one side of the word line;
    a first contact plug connected to the active region on the other side of the word line;
    a variable resistance element connected to the contact plug;
    a bit line connected to the variable resistance element; and
    a source line connected to the auxiliary source line,
    wherein the bit line and the source line are at the same height.

16. The semiconductor memory device of claim 15, further comprising a second contact plug connected between the auxiliary source line and the source line.

* * * * *